United States Patent
Hsu et al.

(10) Patent No.: US 6,349,067 B1
(45) Date of Patent: Feb. 19, 2002

(54) SYSTEM AND METHOD FOR PREVENTING NOISE CROSS CONTAMINATION BETWEEN EMBEDDED DRAM AND SYSTEM CHIP

(75) Inventors: Louis L. Hsu, Fishkill, NY (US); Richard M. Parent, Shelburne, VT (US); Li-Kong Wang, Montvale, NJ (US); Matthew R. Wordeman, Makawao, HI (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/772,461

(22) Filed: Jan. 30, 2001

(51) Int. Cl.[7] .................................................. G11C 7/02
(52) U.S. Cl. ........................................ 365/206; 365/51
(58) Field of Search .......................... 365/206, 63, 207, 365/226, 51

(56) References Cited

U.S. PATENT DOCUMENTS

| | | | |
|---|---|---|---|
| 5,373,476 A | * 12/1994 | Jeon | 365/226 |
| 5,596,534 A | 1/1997 | Manning | 365/189.09 |
| 5,668,755 A | * 9/1997 | Hidaka | 365/181 |
| 5,822,248 A | * 10/1998 | Satori et al. | 365/185.21 |
| 5,999,440 A | 12/1999 | Crafts | 365/149 |
| 6,002,162 A | 12/1999 | Takahashi et al. | 257/544 |
| 6,288,925 B1 | * 9/2001 | Kitsukawa et al. | 365/63 |

* cited by examiner

Primary Examiner—Tan T. Nguyen
(74) Attorney, Agent, or Firm—Scully, Scott, Murphy & Presser; Robert M. Trepp, Esq.

(57) ABSTRACT

A complete solution to block noise from eDRAM macro to the analog core, and vice verse, in a system-on-chip IC design. Specifically, there is provided a first isolated triple well structure formed in the IC for reducing noise component resulting from operative elements of a DC generator circuit fabricated therein; and, a second isolated triple well structure formed in the IC for reducing noise component resulting from operative elements of a noise sense amplifier bank and DRAM arrays fabricated therein. A power supply source is provided for supplying power to each DC generator circuit, noise sense amplifier bank and DRAM array; as is a power bus for providing power and a separate power bus for providing a ground to each of the DC generator circuit, and the noise sense amplifier circuit and DRAM array components. In this manner, noise contamination with noise sensitive devices in said IC is reduced, and, further noise contamination of the DRAM array as sourced from the IC is reduced.

18 Claims, 4 Drawing Sheets

SYSTEM AND METHOD FOR PREVENTING NOISE CROSS CONTAMINATION BETWEEN EMBEDDED DRAM AND SYSTEM CHIP

BACKGROUND OF THE INVENTION

1. Field of the Invention

This invention relates generally to embedded circuits such as DRAM, and more specifically, a system and method for preventing noise cross-contamination between embedded DRAM and system chip.

2. Discussion of the Prior Art

Substrate noise caused by high speed digital circuits has been known as a key problem to the analog circuits on the mixed-signal system-on-chip designs. One major source of noise is from the clock generators of digital circuits. Unfortunately, in system-on-chip circuits comprising embedded DRAM, many free running oscillators are used to generate different internal power supply voltage levels. That is, noise generated from the DRAM macro is mainly from its DC generator block and the sense amplifier banks. Inside the generator block, DRAM macro contains several DC generators, including substrate bias (the Vbb) generator, the boost wordline (the Vpp generator, the negative wordline low (the Vwl) generator, etc. Each of the generators requires an oscillator to be used from the charge pump to generate a higher voltage level higher than Vdd supply, or lower than ground. The frequency of these oscillators is ranged from 5 MHZ to 50 MHZ. These oscillators are formed by, for example, several stages of inverter formed in a ring structure. When an oscillator oscillates, charges are constantly injected into n-well and substrate causing ground and Vdd bouncing. Not only the ring oscillators, but also the pump drivers, and the pumps themselves are sources of noise. Additionally, during DRAM array sensing, on the order of thousands of sense amplifiers are switched simultaneously. That is, for each sensing activity, couple thousands of sense amplifiers are set at the same time, as a result, the Vdd and ground bounding in the sense amplifier regions.

Noise generated from free-running oscillators (e.g., comprising power supply noise) and switching sense amplifiers (switching noise) will interfere with the noise-sensitive core circuits. For example, it has been reported that noise is caused by Vdd and substrate bounding affects the performance of high-precision analog circuits. For example, phase-locked loops used in communication circuits are sensitive to noise-induced clock jitters. To isolate the eDRAM from the noisy environment is very important.

U.S. Pat. No. 5,999,440 describes a system for enhancing noise immunity of an embedded DRAM in a System-on-Chip (SOC). In U.S. Pat. No. 5,999,440 there is described a noise immunity enhancing system for a pMOS eDRAM array. As well known in the industry a pMOS device has poorer performance than the nMOS counterpart under the same technology and ground rule because, electron mobility is inherently faster than hole mobility. DRAM using pMOS devices as the transfer gate is not the technology of choice. That is, almost 99% DRAM produced today all use nMOS to take advantage of the speed, so that the access time and cycle time can be fast. However, using pMOS device one can build pMOS array inside a n-well of a p type substrate which is naturally isolated from other circuits that are built in different n-wells. In this case, no triple-well is needed, therefore cost can be lower. Thus, U.S. Pat. No. 5,999,440 describes just a simple well process, with no teaching or suggestion to implement a triple well structure.

Besides a solution for optimizing the analog circuits to be more noise resistive, a simpler solution for eliminating the noise problem from these noisy circuits is to fabricate potentially noisy components in isolation such as by fabricating them in triple-well structures.

SUMMARY OF THE INVENTION

It is an object of the present invention to provide in mixed-signal circuits having analog and high-speed digital components which generate noise that interferes with the analog circuits, a system and method for eliminating the noise problem from these noisy circuits.

It is an object of the present invention to provide a more complete solution to block noise from an embedded DRAM (eDRAM) macro to an analog core, and vice verse, provided in an integrated circuit (IC).

Specifically, according to the principles of the invention, there is provided a structure to isolate oscillator, drivers, charge pumps, and sense amplifiers, so that noise is not able to propagate into the core or any noise sensitive area of the chip. For example, the noise from sense amplifier will not degrade the data integrity in the array, nor will it affect the quality of analog circuits in the core. First, a guard ring is built around the noisy device areas. Second, a triple well is applied to the same area to block the noise. Third, the ground and Vdd of the generators (from hereon called Vddc and Gndc) and those of the sense amplifiers (Vdds, and Gnds) are separated from those of the rest of the chip. Finally, each Vdd, i.e., Vdds and Vddc, will have its own decoupling capacitor assigned.

Advantageously, such a system and method is important for system-on chip designs comprising DRAM circuits embedded into analog circuits, for example, in the networking, RF, and wireless communications technological areas.

BRIEF DESCRIPTION OF THE DRAWINGS

Further features, aspects and advantages of the apparatus and methods of the present invention will become better understood with regard to the following description, appended claims, and the accompanying drawings where:

FIG. 2(b)' is a schematic diagram depicting a memory cell and sense amplifier circuit of the eDRAM array structure according to the invention.

DETAILED DESCRIPTION OF THE PREFERRED EMBODIMENTS

According to the invention, there is provided a Noise-Proof embedded DRAM (eDRAM) design that is built inside an isolated environment implementing guard ring and triple wells structures to significantly suppress the "noisy" portion of DC generators and from charge pump circuits. The same structure that is applied to the DC generator may additionally be implemented to reduce or suppress noise generated from the sense amplifiers of eDRAM circuits. Further, the system architecture of the invention requires unique placement of decoupling capacitors and integration of power system power supply and ground busses for facilitating further noise reduction.

Figure 1A:
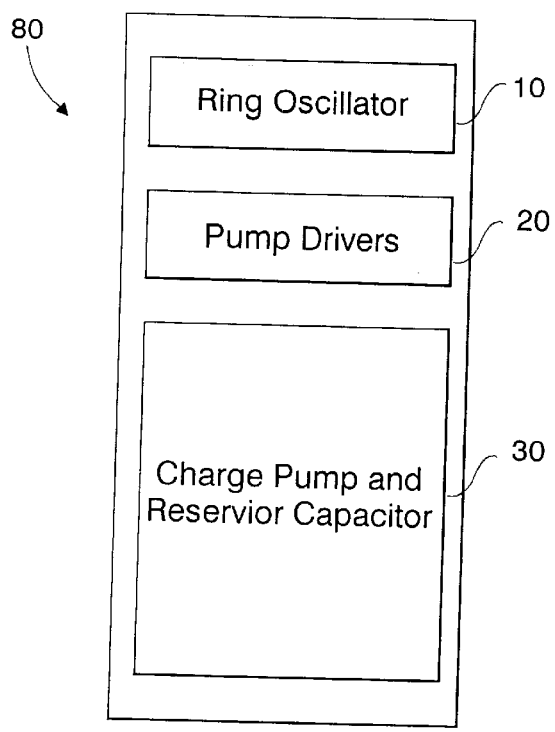
FIG. 1(a) is a circuit diagram illustrating the Noise-free DC generator 80 comprising ring oscillator 10, the pump driver 20, charge pump and reservoir capacitors 30 components.
Figure 1B:
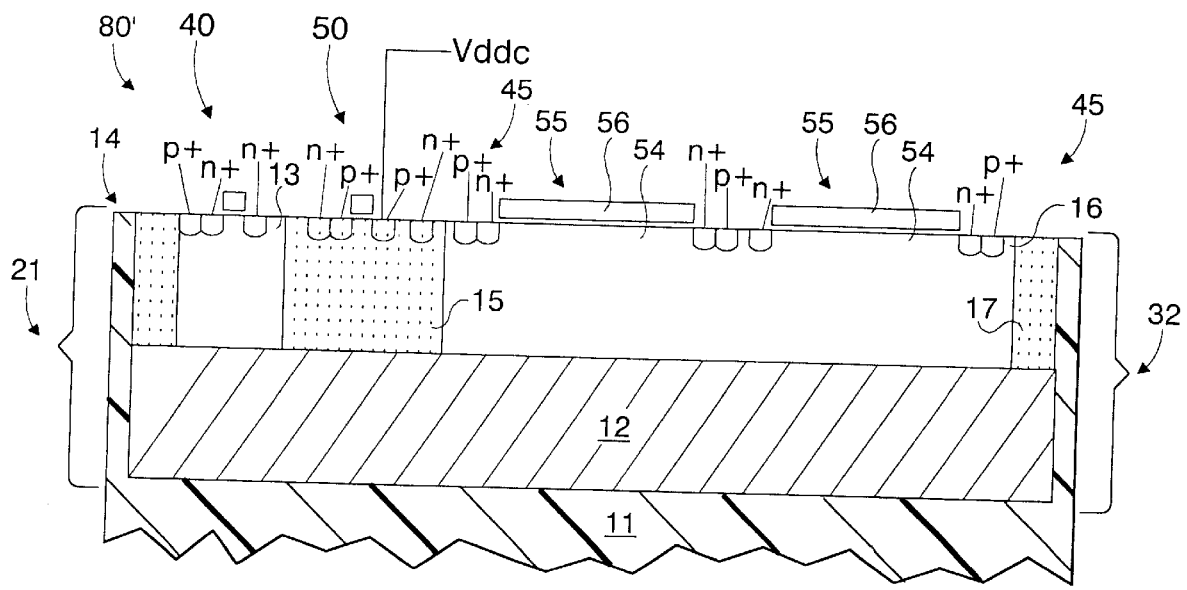
FIG. 1(b) illustrates a cross-sectional structural view of the DC generator circuit for the eDRAM shown in FIG. 1(a) according to the invention.

FIG. 1(a) is a circuit diagram illustrating the noise-free DC generator 80 which is a DC-DC converter comprising ring oscillator 10, the pump driver 20, charge pump and reservoir capacitor 30 components provided for an eDRAM circuit. FIG. 1(b) is a cross-sectional structural view 80' of the noise-free DC generator circuit 80 for the eDRAM of FIG. 1(a). As shown in FIG. 1(b), the eDRAM circuit 80 is built upon a p-type substrate 11. As known, the DC generator ring oscillator 10 and pump driver components of the eDRAM one or more nMOS components 40 to exploit their higher speed characteristics. For complete noise isolation, the ring oscillator 10 and pump drivers 20 having their nMOS components 40 are fabricated within a triple-well structure 21 comprising a p-type well structure 13 that is formed above a buried n-type diffusion layer 12 which is layered above the p-substrate 11. The p-well 13 in which the nMOS components are fabricated, is surrounded by an n-type guard ring structure 14. However, the pMOS devices of the ring oscillator 10 and pump drivers 20 are built in a n-type well structure 15. Thus, in the embodiment depicted in FIG. 1(b), the key components of the DC generator 80 which generate the highest levels of noise are placed in triple-well structures. Usually, the layout of DC generator is not as tight as that of array or sense amplifier, neither is pitch or area limited. Therefore, it is preferable to place each of them in a separated triple-well structure for the reason that better electrical contact is made to the buried n-type diffusion layer 12. As shown in the cross-sectional view of FIG. 1(b), the DC generator pump driver component 20 of the eDRAM comprises one or more MOS devices. For more complete noise isolation, the generator pump driver 20 pMOS components 50 are fabricated within a n-well structure which 15 as shown in FIG. 1(b). In this arrangement, the ground of the DC generator or Gndc is bounded by the reverse biased n-type diffusion layer and, therefore, is decoupled from the lower level p-type substrate 11 which functions as the global ground. Similarly, the Vddc is tied to the isolated n-well, and is decoupled to the other n-type wells.

As further depicted in FIG. 1(b), the charge pump component 30 of the DC generator comprises, for example, a network of diodes (p-n junctions) 45 and reservoir capacitors (caps) 55. As depicted, the capacitors 55 comprise poly n-type gates 56 over n-type diffusion surface 54 for coupling to the oscillators and drivers, and are also isolated in a triple-well structure 32 comprising p-type well structure 16, buried n-diffusion layer 12 and p-type substrate 11. That is, the p-type well structure 16 is formed above the buried n-type diffusion layer 12 which is layered above the p-substrate substrate 11. The p-well 16 in which the reservoir caps and charge pump components are fabricated, is surrounded by an n-type guard ring structure 17 on one side and, the n-type well structure 15 on the other side in which the pMOS devices of the DC Generator pump driver 20 and ring oscillator circuits 10 are formed. In this design, the pump and the reservoir caps are built inside the triple wells for the purpose of separately biasing the body.

Figure 1C:
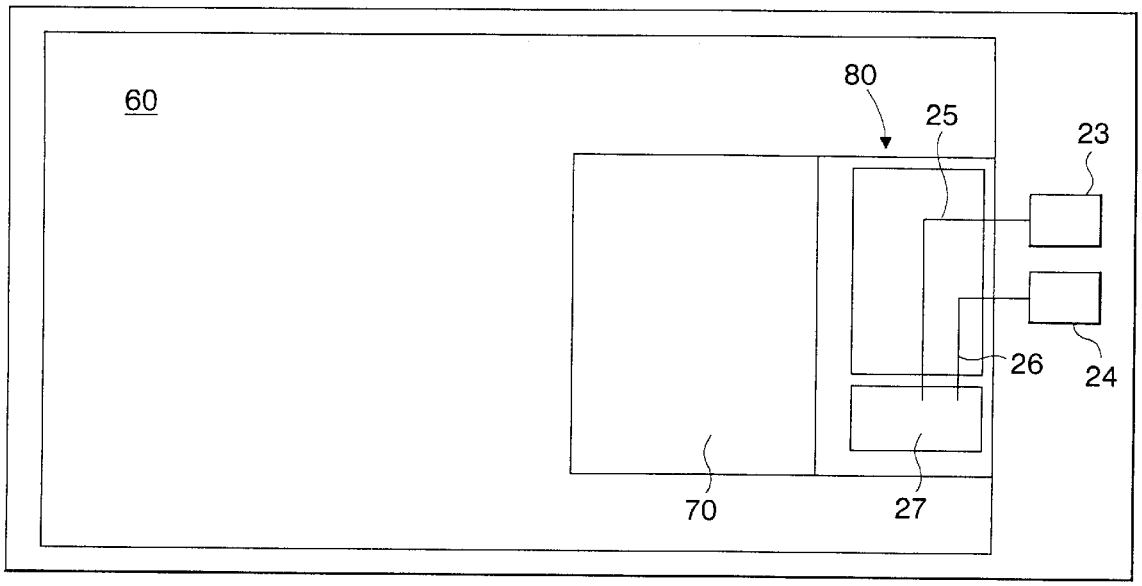
FIG. 1(c) depicts a system architecture of a core circuit 60 comprising a microprocessor, ASIC or analog IC including the embedded the DC generator circuit for the eDRAM array according to the invention.

FIG. 1(c) depicts a system architecture of a core system-on-chip circuit 60 comprising, for example, a microprocessor, ASIC or analog IC, that includes the DC generator circuit 80 for the eDRAM macro 70 according to the invention. As shown in FIG. 1(c), within the eDRAM macro 70, the DC generator 80 is positioned relatively close to the external power supply pin Vddc pin 23 and gndc pin 24 that are dedicated solely for the DC generator in the preferred embodiment. Each external power supply pin 23, 24 are respectively coupled to power busses 25, 26. As further shown in FIG. 1(c), the external power supply Vddc bus 25 and gndc busses are each connected to appropriate number of decoupling capacitors ("decaps") 27. If the power supply pins are not enough, then two or more power busses may share one pin, but each bus will have a sufficient number of decoupling capacitors attached. Preferably, the power busses which are routed to the DC generator are not shared by other components of the core chip 60. Further, as shown in FIG. 1(c), the decoupling capacitors assigned to the power busses to the DC generators are located adjacent to the DC generator areas.

Figure 2C:
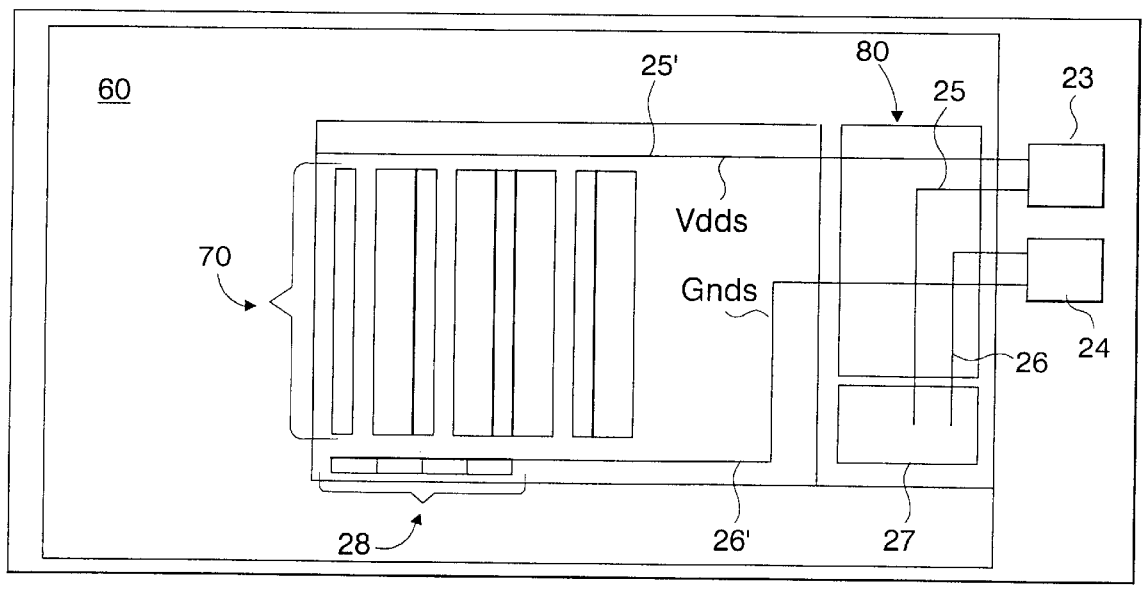
FIG. 2(c) depicts a system architecture of a core circuit 60 comprising a microprocessor, ASIC or analog IC including the embedded eDRAM designed in accordance with the invention.
Figure 2B:
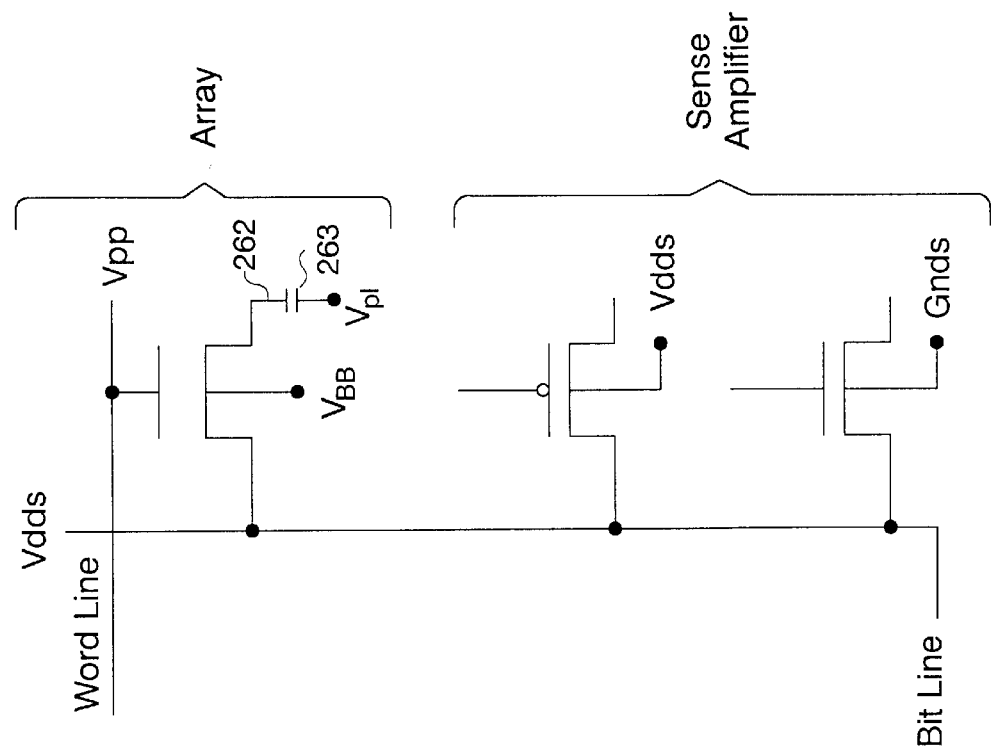
FIG. 2(b) illustrates a cross-sectional view of the eDRAM array structure according to the invention.
Figure 2A:
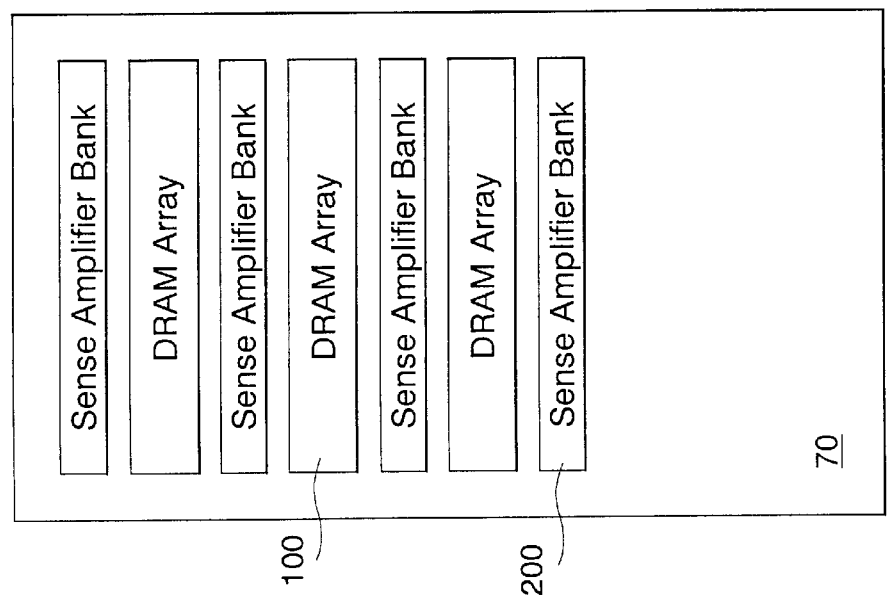
FIG. 2(a) is a diagram illustrating the eDRAM architecture including sense amplifier and DRAM array components.
Figure 2B:
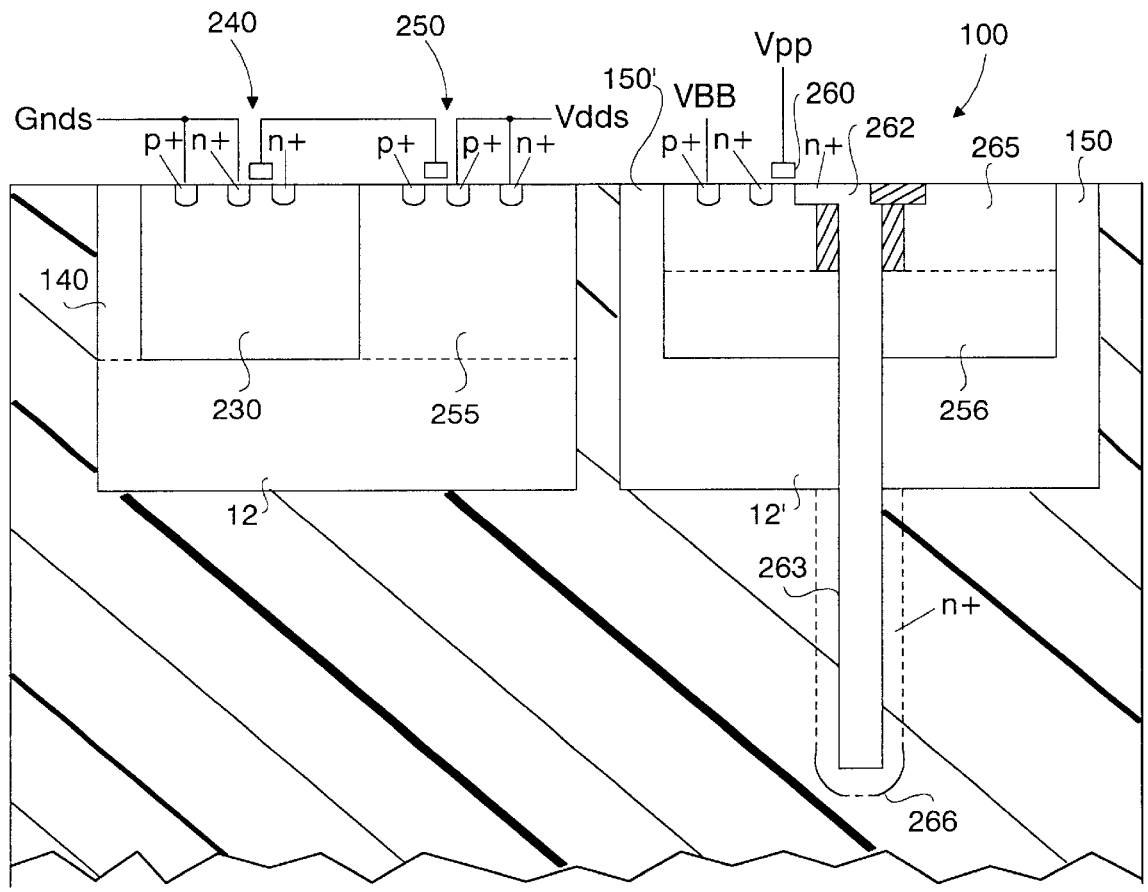

FIG. 2(a) is a circuit diagram illustrating the eDRAM architecture 70 including DRAM array components 100 coupled to one or more sense amplifier banks 200. As known, when one wordline is accessing data in an array memory cell, all the bit-pairs, normally 2000 to 4000 bit-line pairs, of the array will swing simultaneously consequently setting 2000 to 4000 sense amplifiers at the same time. The noise to the ground and Vdd in the sense amplifier bank is significant. In order to avoid such noise jeopardize the array for core performance, the sense amplifier banks of the DRAM macro are isolated in the same manner as the DC generators for the eDRAM. That is, as shown in the cross-sectional diagram of FIG. 2(b), each sense amplifier is located inside an isolated triple-well structure. For example, in the sense amplifier 200 nMOS components 240 are fabricated within an triple-well structure 210 comprising a p-type well structure 230 that is formed above a buried n-type diffusion layer 12 which is layered above the p-substrate 11. The p-well 230 in which the nMOS components 250 are fabricated, is surrounded by an n-type guard ring structure 140 on one side and, a n-type well structure 255 on the other side in which the pMOS devices of sense amplifier pMOS circuits 250 are formed. Thus, in the embodiment depicted in FIG. 2(b), the pMOS devices 250 in the sense amplifier are fabricated in the n-well structure 255 formed above the n-type diffusion layer 12. As shown in FIG. 2(b), the n+ source region of the nMOS devices is connected to a sense amplifier ground which may be noisy as it is isolated from the system ground which is connected to the p-type substrate 11. Further, as shown in FIG. 2(b), in the sense amplifier bank, the n+ drain region of the nMOS device is connected to the p+ drain of the pMOS device 250 forming the output the sense amplifier, and the respective gates of each pMOS and nMOS device are connected to form the bit-line input to a sense amplifier. The P+ source region of the pMOS device 250 is connected to the power supply voltage Vdds which is the sense amplifier power supply.

As shown in FIG. 2(b), the DRAM array structure 100 includes memory cells comprising an nMOS device 260 also fabricated in a triple well structure. That is, a DRAM array comprises nMOS gate transfer devices 260 formed inside a special implanted region 265 which provides the devices with proper threshold voltages. All of the nMOS gates are fabricated in a p-type well structure 256, which is isolated from the p-type substrate 11 by the buried n-type diffusion layer 12'. For reasons as explained in greater detail, the buried n-type diffusion layer 12' is separated by p-type substrate from the buried n-type diffusion layer 12 component of the triple well structure used for the sense amplifier/ word line drivers. The p-type well structure 256 is further isolated by n-type guard rings 150, 150'. The nMOS device 260 particularly comprises a transfer gate for receiving a Vpp or boosted wordline voltage which is connected to a wordline. As shown in FIGS. 2(b) and 2(b)', the body of the nMOS transfer gate 260 and consequently, the p-well region, is tied to $V_{BB}$ (e.g., at −0.5 V) which is the most negative voltage for reverse biasing the junction. Due to the body effect, this provides the nMOS transfer device with a high Vt (threshold voltage) for reducing leakage. One terminal 262 of the nMOS device 260 extends deep into the p-type substrate region to form a capacitor 263 having a ground node represented as n+ diffusion region 266. This capacitor node 263, and hence, n+ diffusion region 266, is tied to Vp1 (½ Vdd) or the plate voltage. As the n+ diffusion region 266 of the capacitor 263 contacts the buried n+diffusion layer 12', this n+ diffusion layer 12' must be isolated from the buried n+ diffusion layer 12 for the sense amplifiers/wordline drivers, as shown in FIG. 2(b).

FIG. 2(c) depicts a system architecture of a core circuit 60 including the embedded eDRAM 70 and DC generator 80 components designed in accordance with the invention. It is understood that, as noise may still provide cross-contamination through the power busses, if they share the same power supply, separate power busses to the array as well as different noisy components such as sense amplifiers, and word line drivers, are provided. The key of providing different power supply busses is to first evaluate their activation timing pattern. For example, if it is determined that an off-chip driver (not shown) and the sense amplifier operate at the same time, then they may not share the same bus. The bus lines for example, Vdd are from the same pin (pad). Vdds is used for the sense-amplifier bank, while Vddc is used for the charge pump, Vddo (not shown) for off-chip driver, etc. Each supply will have a properly sized decoupling capacitor attached, to ensure that supply will not suffer worst-case noise spike. Thus, as shown in FIG. 2(c), separate power busses Vdds 25' and ground bus 26' are used to supply power to the sense amplifier which are different than the busses 25, 26 used to supply the DC generator. It should be understood that Vdds and Vddc are the same voltage and are provided by a common external power supply pin. These busses are isolated from those of the rest of the chip so as to further contain any noise generation from the core. Thus, the Vdds 25', Gnds 26' are separate from the Vddc 25 and Gndc 26 busses however emanate from the same pair of external pins 23, 24 and, are clamped with different set of decoupling capacitor blocks. Preferably, the power busses which are routed to the noise-free sense amplifier banks are not shared by other components of the core chip 60. Further, as shown in FIG. 2(c), the decoupling capacitors assigned to the power busses of the sense amplifier banks are located adjacent to the sense amplifier bank areas. That is, decap elements 27 are located close to the DC generator 80 and are assigned for the power bus to the DC generator. Likewise, the decaps 28 are assigned to the power busses to the sense amplifier banks of the eDRAM 70. It is important that two buses are shielded by a ground line, and attached with proper local decoupling capacitors, so that no coupling noise will occur.

With this arrangement, such an embedded DRAM in a core will not only provide a quiet environment to the noise sensitive core circuits, but also prevent noise attack from the core to the DRAM array. This is true when eDRAM is built into a higher performance processor with super-high speed clock frequency.

This invention has great potential to be used in many products using embedded DRAM/logic technologies. The products can range from high performance serves, PC' such as the IBM PowerPC, workstations as well as portable system for pervasive and wireless applications.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by letters patent is:

1. A system for reducing noise in integrated circuits (IC) having an embedded dynamic random access memory DRAM including one or more DRAM arrays, a DC Generator circuit for said DRAM and one or more and sense amplifier banks coupled to a respective DRAM array, said system comprising:

first isolated triple well structure formed in said IC for reducing noise component resulting from operative elements of a DC generator circuit fabricated therein;

second isolated triple well structure formed in said IC for reducing noise component resulting from operative elements of a noise sense amplifier bank and DRAM arrays fabricated therein.

2. The system for reducing noise as claimed in claim 1, further comprising a power supply source for supplying power to each said DC generator circuit, said noise sense amplifier circuit and DRAM arrays; and, a power bus for providing power and a separate power bus for providing a ground to each of said DC generator circuit, and said noise sense amplifier circuit and DRAM array components, wherein noise contamination with noise sensitive devices in said IC is reduced and, further noise contamination of said DRAM array sourced from said IC is reduced.

3. The system for reducing noise as claimed in claim 2, wherein an operative element of said sense amplifier includes both said nMOS and pMOS transistor devices.

4. The system for reducing noise as claimed in claim 2, wherein said DC generator circuit, and said sense amplifier circuit and DRAM array components are fabricated in close proximity to each other and said power supply source.

5. The system for reducing noise as claimed in claim 2, wherein the power busses which are routed to the sense amplifier banks are not shared by other noise sensitive devices of the IC.

6. The system for reducing noise as claimed in claim 2, wherein the power busses which are routed to the DC generator are not shared by other noise sensitive devices of the IC.

7. The system for reducing noise as claimed in claim 1, wherein an operative element of said DRAM comprises nMOS transistor devices, said integrated triple well structure comprising a p-type well structure having said operative nMOS devices, a p-type substrate, and buried n-diffusion layer formed above said p-substrate and below said p-type well structure.

8. The system for reducing noise as claimed in claim 7, wherein an operative element of said DRAM comprises pMOS transistor devices, said pMOS transistors fabricated within a n-type well structure, said n-type well structure contacting said p-type well structure for further noise containment.

9. The system for reducing noise as claimed in claim 8 wherein said DC generator comprises a ring oscillator having both said nMOS and pMOS transistor devices.

10. The system for reducing noise as claimed in claim 1, further including a n-type guard ring structure for isolating said p-type well structure for further noise containment.

11. The system for reducing noise as claimed in claim 1, further including one or more decoupling capacitors connecting a respective power bus.

12. The system for reducing noise as claimed in claim 11, wherein the decoupling capacitors assigned to the power busses to the DC generators are located adjacent to the DC generator areas.

13. The system for reducing noise as claimed in claim 11, wherein the decoupling capacitors assigned to the power busses to the sense amplifier banks are located adjacent to the sense amplifier bank areas.

14. A method for reducing noise in integrated circuits (IC) having an embedded dynamic random access memory DRAM including one or more DRAM arrays, a DC Generator circuit for said DRAM and one or more and sense amplifier banks coupled to a respective DRAM array, said method comprising:

forming first isolated triple well structure in said IC for reducing noise component resulting from operative elements of a DC generator circuit fabricated therein; and, forming second isolated triple well structure in said IC for reducing noise component resulting from operative elements of a sense amplifier bank and DRAM arrays fabricated therein.

15. The method for reducing noise as claimed in claim 14, further including the step of: providing a separate power bus for supplying power to each of said DC generator circuit, said sense amplifier circuit and DRAM array components, and, a separate ground bus for providing a return to each of said DC generator circuit, said sense amplifier circuit and DRAM array components, wherein noise contamination with noise sensitive devices in said IC in addition to noise contamination in said DRAM array, is reduced.

16. The method for reducing noise as claimed in claim 15, further including preventing sharing of power busses routed to the sense amplifier banks with other noise sensitive devices of the IC.

17. The method for reducing noise as claimed in claim 15, further including preventing power busses routed to the DC generator with other noise sensitive devices of the IC.

18. The method for reducing noise as claimed in claim 14, wherein the step of preventing sharing of power busses includes the steps of:

evaluating activation timing pattern of operating circuits within said IC requiring said power supply, and, if it is determined that a noise-sensitive element in said operates at a same time as an element in said memory DRAM, preventing said sharing of said power bus as between these elements.

* * * * *